United States Patent [19]
Donoghue et al.

[11] Patent Number: 4,563,599
[45] Date of Patent: Jan. 7, 1986

[54] CIRCUIT FOR ADDRESS TRANSITION DETECTION

[75] Inventors: William J. Donoghue, Round Rock, Tex.; Glenn E. Noufer, Colorado Springs, Colo.

[73] Assignee: Motorola, Inc., Schaumburg, Ill.

[21] Appl. No.: 479,788

[22] Filed: Mar. 28, 1983

[51] Int. Cl.<sup>4</sup> ...................... H03K 19/22; H03K 19/08
[52] U.S. Cl. .................................... 307/448; 307/451; 307/453; 307/463
[58] Field of Search ............... 307/448, 449, 450, 453, 307/463, 481, 451; 365/190, 230

[56] References Cited
U.S. PATENT DOCUMENTS 4,000,429 12/1976 Yoshida et al. ...................... 307/246
4,100,430 7/1978 Lesser ................................. 307/205

Primary Examiner—Larry N. Anagnos
Assistant Examiner—Richard Roseen
Attorney, Agent, or Firm—Anthony J. Sarli, Jr.; Jeffrey Van Myers; James L. Clingan, Jr.

[57] ABSTRACT

A circuit uses a pair of transistors in series to provide an output pulse which indicates an address transition has occurred. A duration of joint conductivity of the pair of transistors determines the duration of the output pulse. For an address transition, one of the transistors is rapidly turned on while the other is slowly turned off with a slow fall time. The fall time is adjustable to achieve an adjustable duration of joint conductivity, and thereby an adjustable output pulse width.

13 Claims, 2 Drawing Figures

CIRCUIT FOR ADDRESS TRANSITION DETECTION

BACKGROUND OF THE INVENTION

This invention relates to memory circuits, and more particularly, to memory circuits which detect an address transition.

A technique for improving memories has developed by using a pulse generated from an address transition. In many memory circuits the only time it is necessary to execute a read of data is when a transition of the address occurs. If the address does not change, the data that is being provided on the output is still valid. Consequently, there is no reason to prepare any of the circuitry associated with sensing stored data. This fact has been used to advantage to wait until the address changes to make such preparation. Speed can be increased by precharging bit sense lines in response to an address transition. It is also possible to save power by waiting until an address transition before enabling certain circuitry which is not necessary during steady state operation. In order to implement any of these advantages it is necessary to be able to quickly and reliably detect an address transition.

U.S. Pat. No. 4,099,265, Abe, discloses a technique for address transition detection which uses two series connected transistors for each address bit. One of the transistors receives the true address signal and the other receives the complementary address signal of the particular address bit. For any steady state condition, one of the transistors will be turned on and one will be turned off. During a transition of the address bit, the true and complementary signals will switch states but not instantly. There will be a finite rise and fall time. During this rise and fall time there is a short time during which both transistors are conducting, thereby establishing a conductive path. The establishment of the conductive path provides the detection of the address transition. One of the problems with this technique is that in practice one of the true or complementary signals will begin changing before the other. This can result in a very short duration when the transition is in one direction and a somewhat longer duration when the transition is in the other direction. Consequently, substantial additional circuitry may be required for signal shaping to ensure that the detection pulse is of sufficient duration to be useful.

Another technique is to provide a delay for each of the true and complementary signals. Each delayed signal is coupled to the control electrode of a transistor. Each undelayed address signal is coupled to a current electrode of the transistor which receives the delayed address signal of the opposite logic state. In a steady state condition one of the transistors, the one with a logic high on its control electrode, is conducting while the other transistor is turned off. Because the transistor which is conducting has a logic low on a current electrode, it does not cause a detection signal to be generated. When the address signal changes, however, the current electrode receives a logic high before the control electrode switches to a logic low because of the delay to the control electrode. Consequently for the duration of the delay to the control electrode, the transistor conducts a logic high to its other current electrode. Such presence of the logic high constitutes detection of an address transition. One disadvantage of this technique is that a substantial amount of circuitry is required. One implementation of this technique for a static RAM is described in U.S. Pat. No. 4,355,377, Sud et al.

SUMMARY OF THE INVENTION

An object of the instant invention is to provide an improved circuit for address transition detection.

Another object of the invention is to provide an improved circuit for address transition detection using a pair of series connected transistors.

Yet another object of the invention is to provide a circuit which causes true and complementary address signals to have a slower transition in one direction than the other to facilitate address transition detection.

A further object of the invention is to provide address transition detection with improved immunity to internal true and complementary address signal propagation delay differences.

These and other objects of the invention are achieved by a circuit which uses a pair of transistors in series to provide an output pulse which indicates an address transition has occurred. A duration of joint conductivity of the pair of transistors determines the duration of the output pulse. For an address transition, one of the transistors is rapidly turned on while the other is slowly turned off with a slow fall time. The fall time is adjustable to achieve an adjustable duration of joint conductivity, and thereby an adjustable output pulse width.

DESCRIPTION OF THE DRAWINGS

Figure 1:
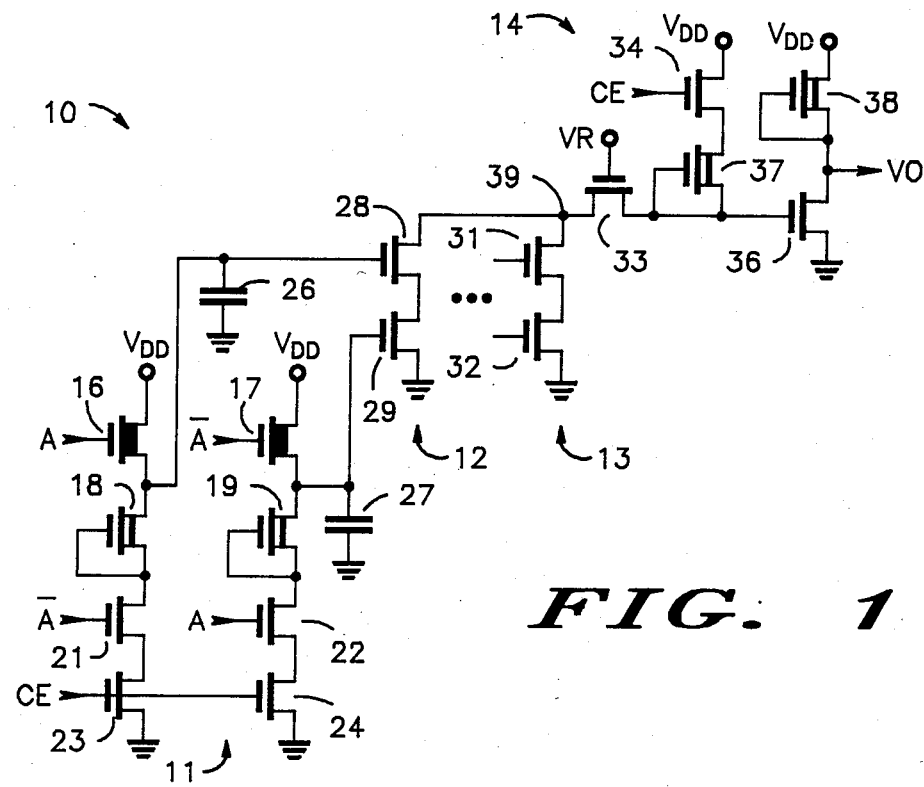
FIG. 1 is a schematic diagram of an NMOS embodiment of the invention.

Shown in FIG. 1 is an address transition detector 10 comprised generally of a rise time/fall time generator 11, a first detection pair 12, a second detection pair 13, and a pulse shaper 14. Generator 11 is comprised of a natural transistor 16, a natural transistor 17, a depletion transistor 18, a depletion transistor 19, an enhancement transistor 21, an enhancement transistor 22, an enhancement transistor 23, an enhancement transistor 24, a capacitor 26, and a capacitor 27. Detection pair 12 is comprised of an enhancement transistor 28 and an enhancement transistor 29. Detector pair 13 is comprised of an enhancement transistor 31 and an enhancement transistor 32. Shaper 14 is comprised of an enhancement transistor 33, enhancement transistor 34, enhancement transistor 36, a depletion transistor 37, and a depletion transistor 38. In a preferred embodiment, all of the transistors of transition detector 10 are N channel insulated gate field effect transistors. The depletion transistors have a threshold voltage of −2.5 to −3.0 volts, the natural transistors have a threshold voltage of −0.1 to 0.1 volt, and the enhancement transistors have a threshold voltage of 0.5 to 0.8 volt.

An address for a memory will have a number of address bits for defining the location within the memory that is to be accessed. A change in any one of the address bits constitutes a change in the location to be accessed. Each address bit has a voltage signal representation. One such representation is a true signal. Another representation is a complementary signal which, as the name implies, is complementary to the true signal. For detector 10 of FIG. 1 a true signal A and a complementary signal $\overline{A}$ represent a single address bit.

Transistor 16 has a drain connected to a positive power supply terminal $V_{DD}$ for receiving a positive power supply voltage, for example, 5 volts; a gate for receiving true signal A; and a source. Transistor 17 has a drain connected to $V_{DD}$, a gate for receiving complementary signal $\overline{A}$, and a source. Transistor 18 has a drain connected to the source of transistor 16, and a gate and a source connected together. Transistor 19 has a drain connected to the source of transistor 17, and a gate and a source connected together. Transistor 21 has a drain connected to the gate and source of transistor 18, a gate for receiving signal $\overline{A}$, and a source. Transistor 22 has a drain connected to the gate and source of transistor 19, a gate for receiving signal A, and a source. Transistor 23 has a drain connected to the source of transistor 21, a gate for receiving a CE signal, and a source connected to a negative power supply terminal for receiving current, shown as ground. The CE signal is a chip enable signal and is a logic high when the circuitry is to be operational and a logic low when it is not to be operational. Transistor 24 has a drain connected to the source of transistor 22, a gate for receiving the CE signal, and a source connected to ground. Capacitor 26 is connected between the drain of transistor 18 and ground. Capacitor 27 is connected between the drain of transistor 19 and ground. Transistor 28 has a drain connected to a node 39, a gate connected to the drain of transistor 18, and a source. Transistor 29 has a drain connected to the source of transistor 28, a gate connected to the drain of transistor 19, and a source connected to ground. Transistor 31 has a drain connected to node 39, a gate, and a source. Transistor 32 has a drain connected to the source of transistor 31, a source connected to ground, and a gate. Transistor 33 has a source connected to node 39, a gate connected to a reference voltage terminal VR for receiving a reference voltage, and a drain. Transistor 34 has a drain connected to $V_{DD}$, a gate for receiving the CE signal, and a source. Transistor 36 has a drain for providing an output signal VO, a gate connected to the drain of transistor 33, and a source connected to ground. Transistor 37 has a drain connected to the source of transistor 34, and a gate and a drain connected to the drain of transistor 33. Transistor 38 has a drain connected to $V_{DD}$, and a gate and source connected to the drain of transistor 36.

Assume as initial conditions that the circuit is enabled with the CE signal at a logic high, that true signal A is a logic high, and that complementary signal $\overline{A}$ is a logic low. With the CE signal at a logic high, transistors 23, 24, and 34 are turned on which causes, respectively, the source of transistor 21 to be coupled to ground, the source of transistor 22 to be coupled to ground, and the drain of transistor 37 to be at a voltage which is an enhancement threshold voltage less than the voltage of the CE signal. With signal A at a logic high, transistor 16 couples a logic high to the gate of transistor 28, turning on transistor 28. Transistor 22 also is turned on which causes the gate of transistor 29 to be coupled to ground via transistors 19, 22, and 24, so that transistor 29 is turned off. Consequently, there is no current path between node 39 and ground via transistors 28 and 29. Node 39 is at a voltage which is an enhancement threshold voltage lower than the voltage at VR. The reference voltage is chosen to be a convenient voltage near 3.5 volts by conventional means. The voltage on node 39 is thus relatively low to reduce the voltage swing at node 39 when it switches to a logic low. This is a conventional technique which is particularly applicable for nodes which have high capacitance. With transistor 34 turned on, a logic high is coupled to the gate of transistor 36 via transistor 37, so that transistor 36 is turned on. With transistor 36 turned on, signal VO is a logic low.

When true signal A switches to a logic low, complementary signal $\overline{A}$ switches to a logic high. Accordingly, transistors 16 and 22 are turned off, while transistors 21 and 17 are turned on. Transistor 21 thereby begins drawing current from capacitor 26 which was previously charged at a logic high to nearly 5 volts, while transistor 17 is providing current to capacitor 27. Transistor 17 is chosen to have a gain which is relatively high so that capacitor 27 is charged very quickly to a logic high so that transistor 29 turns on. Transistor 18 acts as a current limiting device to limit the rate at which capacitor 26 is discharged. Consequently, the voltage on the gate of transistor 28 is reduced below the threshold voltage of transistor 28 in a greater amount of time than the time required for the voltage on the gate of transistor 29 to exceed the threshold voltage of transistor 29. Transistors 28 and 29 are thereby both on at the same time. This time duration of joint conductivity is from the time the threshold voltage of transistor 29 is exceeded until the voltage on the gate of transistor 28 falls below the threshold voltage of transistor 28. During joint conductivity of transistors 28 and 29, node 39 is coupled to ground. The gate of transistor 36 is coupled to ground via transistor 33, turning off transistor 36. This causes signal VO to switch to a logic high. Signal VO remains at a logic high for the duration of joint conductivity because node 39 will remain at essentially ground potential for the duration of joint conductivity, keeping transistor 36 turned off. When the voltage on the gate of transistor 28 is reduced sufficiently to turn off transistor 28, there is no longer a current path between node 39 and ground. Likewise, there is no current path to ground from the gate of transistor 36 so that the gate voltage rises to a logic high via transistors 37 and 34, causing transistor 36 to turn on and thereby causing signal VO to switch to a logic low.

The time duration of joint conductivity of transistors 28 and 29, in response to true signal A switching from a logic high to a logic low, is a function of the gain of transistor 17, 18, and 21, the capacitance on the gate of transistor 28, and the capacitance on the gate of transistor 29. The capacitance on the gates of transistors 28 and 29 includes not only the capacitance of capacitors 26 and 27, respectively, but also parasitic capacitance. How to adjust charge and discharge rates using transistor gain and capacitance for given input voltages is known in the art. Consequently, the pulse width of signal VO is conveniently adjustable.

When true signal A switches from a logic low to a logic high, another duration of joint conductivity of transistors 28 and 29 results which causes signal VO to be provided at a logic high for the duration of joint conductivity. The action which causes the duration of joint conductivity is substantially the same as for signal A switching from a logic high to a logic low. Signal A switching to a logic high of course means that signal $\overline{A}$ switches to a logic low. Consequently, transistor 16 rapidly applies a logic high to the gate of transistor 28, turning transistor 28 on. Transistor 22 also turns on but causes the gate of transistor 29 to be reduced in voltage at a slower rate than the rate at which transistor 16 increased the voltage on the gate of transistor 28. This causes the voltage on the gate of transistor 28 to exceed the threshold voltage of transistor 28 before the voltage on the gate of transistor 29 is reduced below the threshold voltage of transistor 29. Consequently, both transistors 28 and 29 are turned on at the same time, causing signal VO to be a logic high. The duration of the time of joint conductivity is the time required for the voltage on the gate of transistor 29 to be reduced to an enhancement threshold voltage minus the time required for the voltage on the gate of transistor 28 to reach an enhancement threshold voltage. As stated previously, these times can be selected by conventional techniques using transistor gain and capacitance.

In most applications, it would be preferred to remove transistors 18 and 19 to reduce the chip area required for detector 10. In such a case, the drain of transistor 21 is directly connected to the source of transistor 16, and the drain of transistor 22 is directly connected to the source of transistor 17. Transistor 21 then has a gain significantly less than the gain of transistor 17, and the gain of transistor 22 is significantly less than the gain of transistor 16. The duration of joint conductivity which determines the duration at which signal VO is at a logic high is thus determined by adjusting the relative gains of transistors 17 and 21 and transistors 22 and 16 as well as the capacitance of capacitors 26 and 27, the same adjusting technique as for the logic high to logic low transition. Even if the transitions of signals A and $\overline{A}$ do not occur exactly simultaneously, fall times on the gates of transistors 28 and 29 are sufficiently selectable so as to ensure a desired minimum pulse width of signal VO. Transistors 18 and 19 are useful for showing that resistive or current-limiting elements can be used for adjusting the discharge rate of the capacitance on the gates of transistors 28 and 29, respectively.

Transistors 23 and 24 are useful for reducing power consumption by rise time/fall time generator 11 for a memory which causes both signals A and $\overline{A}$ to be a logic high when the CE signal is a logic low. Otherwise, transistors 23 and 24 are unnecessary for the operation of detector 10. Transistor 34 is also useful for reducing power consumption. If both signals A and $\overline{A}$ are a logic high, then both transistors 28 and 29 are turned on which provides a current path from $V_{DD}$ to ground unless transistor 34 is turned off, which it is when the CE signal is a logic low.

Transistors 31 and 32 of second detection pair 13 show that other detection pairs can be coupled to node 39 for the purpose of causing signal VO to switch to a logic high. A typical memory will have a number of column address bits and a number of row address bits. A change in any one of these address bits constitutes an address transition which requires accessing a new location in the memory. For each address bit transition which is to be detected there will be another rise time/fall time generator like generator 11 which receives the address bit and provides an output to a detection pair like pair 12 or 13. A transition of any such address bit will then cause its corresponding detection pair to have a duration of joint conductivity which will cause signal VO to be a logic high for this duration of joint conductivity.

It may also be desirable to have more than one detector like detector 10 for a given memory. For example, it may be desirable to have a different duration of signal VO at a logic high for a column address transition than for a row address transition. In such a case there could be a separate address transition detector for the column address bits and for the row address bits.

Figure 2:
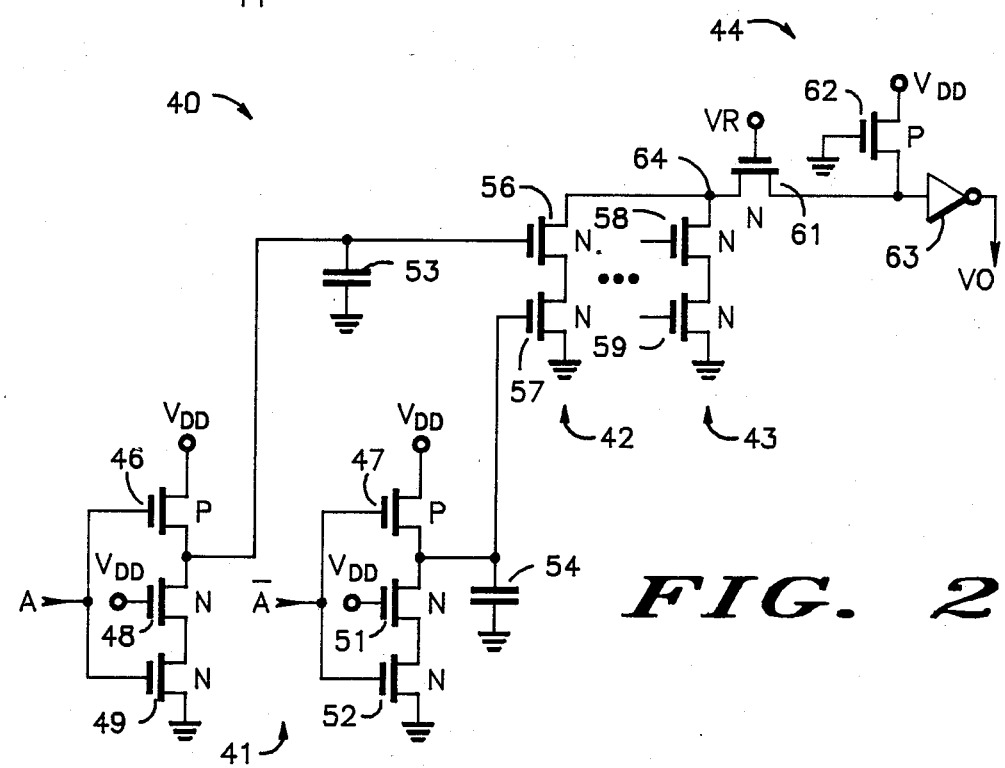
FIG. 2 is a schematic diagram of a CMOS embodiment of the invention.

Shown in FIG. 2 is an address transition detector 40 comprised generally of a rise time/fall time generator 41, a first detection pair 42, a second detection pair 43, and a pulse shaper 44. Generator 41 is comprised of a P channel transistor 46, a P channel transistor 47, an N channel transistor 48, an N channel transistor 49, an N channel transistor 51, an N channel transistor 52, a capacitor 53, and a capacitor 54. Detector pair 42 comprises an N channel transistor 56 and an N channel transistor 57. Detector pair 43 comprises an N channel transistor 58 and an N channel transistor 59. Pulse shaper 44 comprises an N channel transistor 61, a P channel transistor 62, and an inverter 63. In a preferred embodiment, the N channel transistors are N channel enhancement mode insulated gate field effect transistors having a threshold voltage of 0.4 to 0.8 volt. The P channel transistors are P channel enhancement mode insulated gate field effect transistors having a threshold voltage of $-0.4$ to $-0.8$ volt.

Transistor 46 has a source connected to $V_{DD}$, a gate for receiving true signal A, and a drain. Transistor 47 has a source connected to $V_{DD}$, a gate for receiving complementary signal $\overline{A}$, and a drain. Transistor 48 has a drain connected to the drain of transistor 46, a gate connected to $V_{DD}$, and a source. Transistor 49 has a drain connected to the source of transistor 48, a gate for receiving signal A, and a source connected to ground. Transistor 51 has a drain connected to the drain of transistor 47, a gate connected to $V_{DD}$, and a source. Transistor 52 has a drain connected to the source of transistor 51, a gate for receiving signal $\overline{A}$, and a source connected to ground. Capacitor 53 is connected between the drain of transistor 46 and ground. Capacitor 54 is connected between the drain of transistor 47 and ground. Transistor 56 has drain connected to a node 64, a gate connected to the drain of transistor 46, and a source. Transistor 57 has a drain connected to the source of transistor 56, a gate connected to the drain of transistor 47, and a source connected to ground. Transistor 58 has a drain connected to node 64, a gate, and a source. Transistor 59 has a drain connected to the source of transistor 58, a source connected to ground, and a gate. Transistor 61 has a source connected to node 64, a gate connected to VR, and a drain. Transistor 62 has a source connected to $V_{DD}$, a gate connected to ground, and a drain connected to the drain of transistor 61. Inverter 63 has an input coupled to the drain of transistor 62, and an output for providing an output signal VO.

Detector 40 operates essentially the same as detector 10 except in a CMOS embodiment. Transistor 46 is analogous to transistor 17, transistor 49 is analogous to transistor 22, transistor 47 is analogous to transistor 16, and transistor 52 is analogous to transistor 21. Transistors 48 and 51 are analogous to transistors 19 and 18, respectively, capacitors 53 and 54 are analogous to capacitors 27 and 26, respectively, detector pairs 42 and 43 are analogous to detector pairs 12 and 13, respectively, and pulse shaper 44 is analogous to pulse shaper 14. As for pair 42, when both transistors 56 and 57 are turned on, signal VO is provided at a logic high. Transistor 61 is for the purpose of reducing the voltage level at node 64. When node 64 is coupled to ground, the input of inverter 63 is also coupled to ground causing it to provide signal VO at a logic high.

For detector 10 of FIG. 1, when true signal A switches to a logic low, transistor 17 provides a logic high to the gate of transistor 29 with a fast rise time while transistor 21 is drawing the gate of transistor 28 to a logic low but with a relatively slow fall time. In the same way for detector 40, when true signal A switches to a logic low, transistor 46 provides a logic high to the gate of transistor 56 at a fast rise time while transistor 52 is drawing the gate of transistor 57 to a logic low but with a relatively slow fall time. The rise and fall times are adjusted by conventional transistor gain-capacitance techniques to obtain a desired duration of joint conductivity of transistors 56 and 57. During the joint conductivity of transistors 56 and 57, node 64 is pulled to a logic low which causes signal VO to be a logic high. When transistor 52 pulls the voltage on the gate of transistor 57 below its threshold voltage, transistor 57 turns off, terminating the duration of joint conductivity and thereby bringing signal VO to a logic low. Analogous transistors 21 and 52 are both turned on for the purpose of relatively slowly providing a logic low by complementary signal $\overline{A}$, but analogous transistors 46 and 17 which rapidly provide a logic high are turned on by different signals. Both transistors are turned on when true signal A switches to a logic low but transistor 17, being N channel, is actually turned on by receiving complementary signal $\overline{A}$ which switches to a logic high when true signal A switches to a logic low. Transistor 46 turns on upon receiving signal A at a logic low because transistor 46 is P channel.

For detector 10, when true signal A switches to a logic high, transistor 16 provides a logic high with a fast rise time to the gate of transistor 28 while transistor 22 pulls the gate of transistor 29 to a logic low with a relatively slow fall time. In the same way for detector 40, when true signal A switches to a logic high, transistor 47 provides a logic high to the gate of transistor 57 with a fast rise time while transistor 49 pulls the gate of transistor 56 to a logic low but with a relatively slow fall time. Accordingly there is a duration of joint conductivity of transistors 56 and 57 which causes signal VO to be a logic high until the voltage on the gate of transistor 56 falls below its threshold voltage.

In most applications transistors 48 and 51 can be removed to reduce chip area required for detector 40. In such a case the drain of transistor 49 is directly connected to the drain of transistor 46, and the drain of transistor 52 is directly connected to the drain of transistor 47. Transistor 52 is then adjusted to have significantly lower gain than transistor 46, and transistor 49 is adjusted to have significantly lower gain than transistor 47. That a discharge rate can be set by adjusting gain and capacitance is known in the art. Capacitors 53 and 54 may not be required to achieve a particular desired pulse width of signal VO. Capacitance associated with the drains of transistors coupled to the gates of transistors 56 and 57 may be sufficient. The mere fact that the drain of a transistor is connected to the gate of a transistor means that capacitance has been connected to that gate. Transistors 51 and 48 are for showing that resistive or current-limiting devices can be inserted for adjusting the fall times in conjunction with capacitance. For detector 40, as previously described for detector 10, other rise time/fall time generators like generator 41 can be coupled to detection pairs like pairs 42 and 43 for causing signal VO to switch to a logic high in response to other address bits in transition. It should be noted that, as is typical in CMOS, detector 40 does not consume power in a static condition.

While the invention has been described in specific embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

We claim:

1. A circuit for detecting a transition of an address signal comprising:

a pair of transistors whose conduction paths are coupled in series between a detection node and a first power supply terminal, wherein each of the first and second transistors of the pair has a control electrode, and wherein each transistor is characterized as being conductive when a first logic state is present on its control electrode;

a first capacitance coupled to the control electrode of the first transistor;

a second capacitance coupled to the control electrode of the second transistor;

first providing means for providing the first logic state to the control electrode of the first transistor when the address signal switches to a first condition;

second providing means for providing the first logic state to the control electrode of the second transistor when the address signal switches to a second condition;

first removing means for removing the first logic state from the control electrode of the first transistor when the address signal switches to the first condition, said removing occurring a predetermined time after the second providing means provides the first logic state to the control electrode of the second transistor; and second removing means for removing the first logic state from the control electrode of the second transistor when the address signal switches to the second condition, said removing occurring a predetermined time after the first providing means provides the first logic state to the control electrode of the first transistor.

2. The circuit of claim 1 wherein the address signal has a true signal and a complementary signal representation and wherein:

the first providing means comprises a third transistor having a first current electrode coupled to a second power supply terminal, a control electrode for receiving the true signal, and a second current electrode coupled to the control electrode of the first transistor, and having a characteristic gain;

the second providing means comprises a fourth transistor having a first current electrode coupled to the second power supply terminal, a control electrode for receiving the complementary signal, and a second current electrode coupled to the control electrode of the second transistor, and having a characteristic gain;

the first removing means comprises a fifth transistor having a first current electrode coupled to the control electrode of the first transistor, a control electrode for receiving the complementary signal, and a second current electrode coupled to the first power supply terminal, and having a characteristic gain which is significantly lower than the characteristic gain of the fourth transistor; and the second removing means comprises a sixth transistor having a first current electrode coupled to the control electrode of the second transistor, a control electrode for receiving the true signal, and a second current electrode coupled to the first power supply terminal, and having a characteristic gain which is significantly smaller than the characteristic gain of the third transistor.

3. The circuit of claim 2 further comprising output means for detecting a duration of joint conductivity of the first and second transistors and providing an output pulse in response thereto.

4. The circuit of claim 3 wherein all of the transistors are N channel transistors.

5. The circuit of claim 1 wherein the address signal has a true signal and a complementary signal representation and wherein:

the first providing means comprises a third transistor having a first current electrode coupled to a second power supply terminal, a control electrode for receiving the complementary signal, and a second current electrode coupled to the control electrode of the first transistor, and having a characteristic gain;

the second providing means comprises a fourth transistor having a first current electrode coupled to the second power supply terminal, a control electrode for receiving the true signal, and a second current electrode coupled to the control electrode of the second transistor, and having a characteristic gain;

the first removing means comprises a fifth transistor having a first current electrode coupled to the control electrode of the first transistor, a control electrode for receiving the complementary signal, and a second current electrode coupled to the first power supply terminal, and having a characteristic gain which is significantly lower than the characteristic gain of the fourth transistor; and the second removing means comprises a sixth transistor having a first current electrode coupled to the control electrode of the second transistor, a control electrode for receiving the true signal, and a second current electrode coupled to the first power supply terminal, and having a characteristic gain which is significantly smaller than the characteristic gain of the third transistor.

6. The circuit of claim 5 further comprising output means for detecting a duration of joint conductivity of the first and second transistors and providing an output pulse in response thereto.

7. The circuit of claim 6 wherein the third and fourth transistors are P channel transistors, and the first, second, fifth and sixth transistors are N channel transistors.

8. A circuit for detecting a transition of a signal, comprising:

a pair of transistors whose conduction paths are coupled in series between a detection node and a first power supply terminal, wherein each of the first and second transistors of the pair has a control electrode, and wherein each transistor is characterized as being conductive when a first logic state is present on its control electrode;

a first capacitance coupled to the control electrode of the first transistor;

a second capacitance coupled to the control electrode of the second transistor;

providing means for providing the first logic state to the control electrode of the first transistor when the signal switches to a first condition; and removing means for removing the first logic state from the control electrode of the second transistor when the signal switches to the first condition, said removing occurring a predetermined time after the providing means provides the first logic state to the control electrode of the first transistor.

9. The circuit of claim 8, wherein:

the providing means comprises a third transistor having a first current electrode coupled to a second power supply terminal, a control electrode for receiving the signal, and a second current electrode coupled to the control electrode of the first transistor, and having a characteristic gain; and the removing means comprises a fourth transistor having a first current electrode coupled to the control electrode of the second transistor, a control electrode for receiving the signal, and a second current electrode coupled to the first power supply terminal, and having a characteristic gain which is significantly smaller than the characteristic gain of the third transistor.

10. The circuit of claim 9 wherein the signal has a true signal and a complementary signal representation, wherein the control electrodes of the third and fourth transistors each receive the true signal, and wherein the first, second, third, and fourth transistors are N channel transistors.

11. The circuit of claim 9 wherein the signal has a true signal and a complementary signal representation, and wherein:

the control electrode of the third transistor receives the complementary signal;

the control electrode of the fourth transistor receives the true signal;

the third transistor is a P channel transistor; and the first, second, and fourth transistors are N channel transistors.

12. The circuit of claim 8, wherein:

the providing means comprises a third transistor having a first current electrode coupled to a second power supply terminal, a control electrode for receiving the signal, and a second current electrode coupled to the control electrode of the first transistor; and the removing means comprises a fourth transistor having a first current electrode coupled to the control electrode of the second transistor, a control electrode for receiving the signal, and a second current electrode coupled to the first power supply terminal, and a fifth transistor interposed between the first current electrode of the fourth transistor and the control electrode of the second transistor for causing the removal of the first logic state from the control electrode of the second transistor to occur a predetermined time after the providing means provides the first logic state.

13. A circuit for detecting a transition of complementary signals, comprising:

a pair of transistors whose conduction paths are connected in series;

output means having an input coupled to the pair of transistors and providing an output pulse when both of the pair of transistors are conducting; and means for receiving the complementary signals and providing a first and a second output to the pair of transistors, the means for receiving being capable of enabling one of the pair of transistors and before turning off the other of the pair of transistors upon a transition of the complementary signals.

* * * * *